United States Patent [19]

Friedmann et al.

[11] Patent Number: 6,103,305
[45] Date of Patent: Aug. 15, 2000

[54] METHOD OF FORMING A STRESS RELIEVED AMORPHOUS TETRAHEDRALLY-COORDINATED CARBON FILM

[75] Inventors: Thomas A. Friedmann, Albuquerque; John P. Sullivan, Placitas, both of N. Mex.

[73] Assignee: Sandia Corporation, Albuquerque, N. Mex.

[21] Appl. No.: 09/447,523

[22] Filed: Nov. 23, 1999

Related U.S. Application Data

[63] Continuation-in-part of application No. 08/979,428, Nov. 26, 1997, abandoned.

[51] Int. Cl.[7] .............................. C23C 16/26; B05D 3/02
[52] U.S. Cl. ..................... 427/249.7; 427/372.2; 427/596; 427/553; 427/554; 427/902; 427/904
[58] Field of Search ............................. 427/249.7, 372.2, 427/596, 553, 554, 902, 904; 264/81

[56] References Cited

U.S. PATENT DOCUMENTS

| | | | |
|---|---|---|---|
| 4,884,476 | 12/1989 | Okuzumi et al. | 76/101 R |
| 5,146,481 | 9/1992 | Garg et al. | 378/35 |
| 5,314,652 | 5/1994 | Simpson et al. | 264/81 |
| 5,455,081 | 10/1995 | Okada et al. | 427/528 |
| 5,569,501 | 10/1996 | Bailey et al. | 427/577 |

OTHER PUBLICATIONS

Park et al, Appl. Phys. Lett. 68(25) pp. 3594–3595, Jun. 1996.

Bunshah et al, "Deposition Technologies For Films and Coatings," Noyes Publication, pp. 68–70.

Friedmann et al, Appl. Phys. Lett,. 71(26), pp. 3820–3822, Dec. 1997.

*Primary Examiner*—Roy V. King
*Attorney, Agent, or Firm*—George H. Libman

[57] ABSTRACT

A stress-relieved amorphous-diamond film is formed by depositing an amorphous diamond film with specific atomic structure and bonding on to a substrate, and annealing the film at sufficiently high temperature to relieve the compressive stress in said film without significantly softening said film. The maximum annealing temperature is preferably on the order of 650° C., a much lower value than is expected from the annealing behavior of other materials.

19 Claims, 6 Drawing Sheets

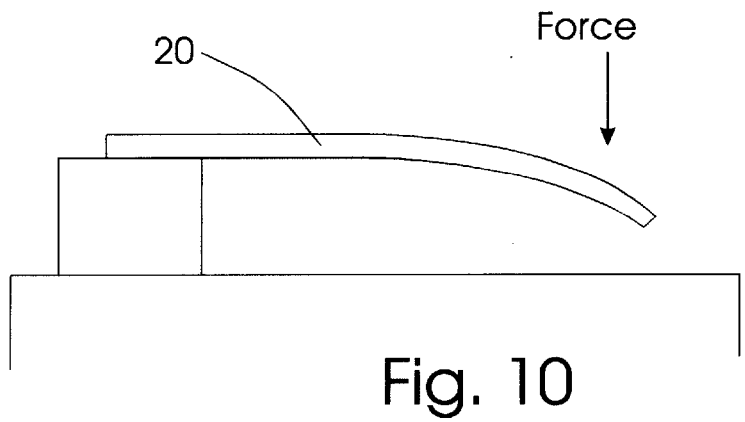
Fig. 10
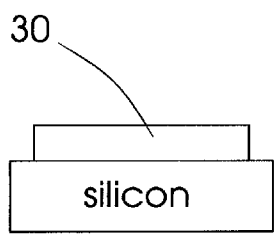 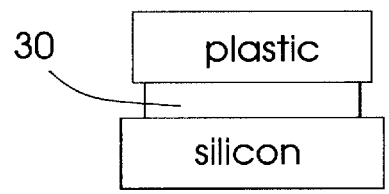 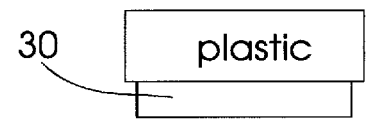
Fig. 11A  Fig. 11B  Fig. 11C
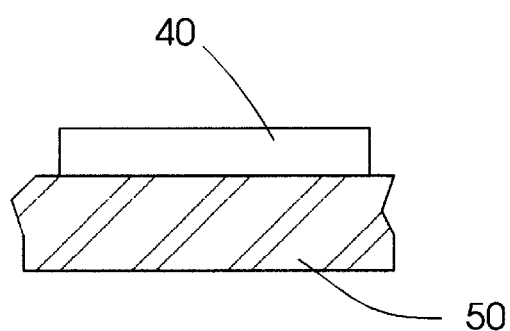 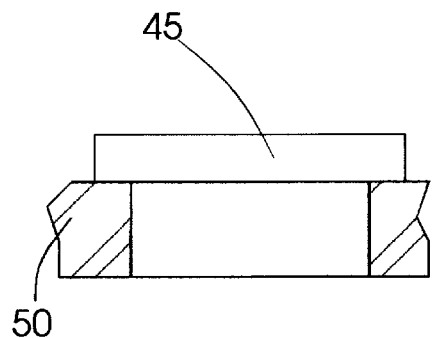
Fig. 12A  Fig. 12B

METHOD OF FORMING A STRESS RELIEVED AMORPHOUS TETRAHEDRALLY-COORDINATED CARBON FILM

CROSS REFERENCE TO RELATED APPLICATIONS

This application is a continuation in part of Ser. No. 08/979,428, filed Nov. 26, 1997, now abandoned.

The United States Government has rights in this invention pursuant to Department of Energy Contract No. DE-AC04-94AL85000 with Sandia Corporation.

BACKGROUND OF THE INVENTION

Amorphous diamond films (also known in the literature as highly tetrahedral amorphous carbon (ta—C), amorphic diamond™, or amorphous carbon, a—C,) is an amorphous form of carbon that has a high fraction (>~50%) of 4-fold coordinated carbon atoms (similar to the bonding found in crystalline diamond) with the rest of the carbon atoms being 3-fold coordinated (similar to the bonding found in graphite). These amorphous diamond films are deposited by pulsed laser deposition (PLD) using a solid graphite target and (typically) an excimer laser, cathodic or filtered arc deposition using graphite electrodes, or mass-selected carbon ion deposition. The key requirement for the formation of amorphous diamond films is that the film is produced, at least in part, by the deposition of carbon ions with high energies (typically, 10 to 100 eV). These films are transparent, insulating, extremely hard, and contain negligible (<0.1%) amounts of hydrogen. These films also have very high (>6 GPa) compressive stress which introduces severe limitations for their application: (1) it limits the film thickness which can be deposited (to typically <1500 Å); (2) it causes problems with adhesion of the films on various substrates; (3) it inhibits the ability to make free-standing membranes; (4) it can cause deformation in the shape of amorphous diamond structures when released from the substrate; and (5) it can cause the substrate to distort (to become bowed).

For a PLD film, the compressive stresses are generated continuously during film growth (e.g., the compressive stress remains roughly constant as a function of film thickness). D. R. McKenzie et al, Phys. Rev. Lett. 67, 773 (1991) suggests, based on thermodynamic arguments, that these high internal compressive film stresses are a necessary condition for the formation of carbon films with a high concentration of diamond-like, 4-fold coordinated atoms. Alternatively, J. Robertson, Diamond Relat. Mater. 3, 361 (1994), suggests that the high compressive stresses are simply the result of densification in the films due to implantation of energetic carbon species (10–100 eV) generated during the deposition process. Finally, M. Tamor, *Applications of Diamond Films and Related Materials: Third International Conference*, 1995, pg. 691 (1995), proposes that the high compressive stresses are a result of local dilatation within the film which occurs when a 4-fold coordinated carbon atom "relaxes" to a 3-fold coordination during film growth.

SUMMARY OF THE INVENTION

It is an object of this invention to provide very low stress amorphous diamond films.

It is another object of this invention to relieve the stress of specific types of amorphous diamond by relatively low temperature annealing.

Additional objects, advantages, and novel features of the invention will become apparent to those skilled in the art upon examination of the following description or may be learned by practice of the invention. The objects and advantages of the invention may be realized and attained as particularly pointed out in the appended claims.

To achieve the foregoing and other objects, and in accordance with the purpose of the present invention, as embodied and broadly described herein, the present invention may comprise a method for making a stress-free amorphous-diamond film comprising depositing an amorphous diamond film with specific atomic structure and bonding on to a substrate, and annealing the film at sufficiently high temperature to relieve the compressive stress in said film without significantly softening said film. The maximum annealing temperature is preferably on the order of 650° C.

BRIEF DESCRIPTION OF THE DRAWINGS

The accompanying drawings, which are incorporated in and form part of the specification, illustrate an embodiment of the present invention and, together with the description, serve to explain the principles of the invention.

FIG. 10 shows an a-tC film used in a MEMS application.

FIGS. 11A–11C show an a-tC film transferred to a plastic substrate.

FIGS. 12A–12B show the fabrication and use of stress relieved a-tC membrances.

DETAILED DESCRIPTION OF THE INVENTION

Figure 1:
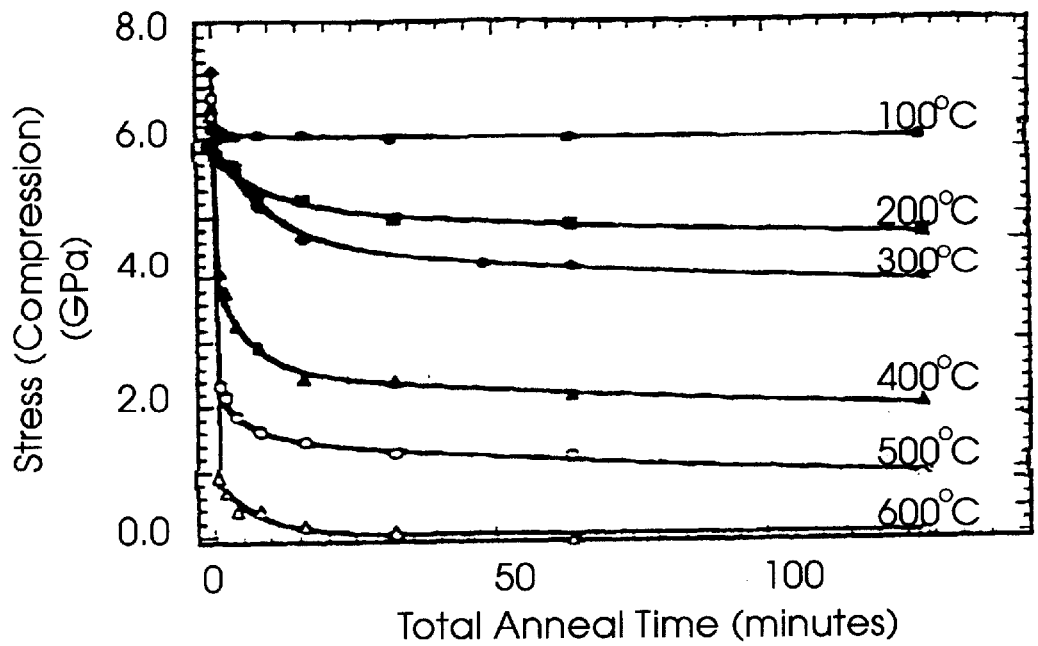
FIG. 1 shows time and temperature dependent stress relaxation of a-tC.

The essence of the invention is surprisingly simple: certain amorphous carbon films with specific atomic structure and bonding, as described below, have very low stress (<100 Mpa), or are stress-free, after annealing for a relatively short period of time (typically less than one hour) at a relatively low temperature (typically less than 700° C.). The ability to achieve stress-free films of this material following relatively low temperature annealing is due to a stress relaxation mechanism that is different than any other known material. In contrast, in order to activate the conventional diffusional stress relaxation in this material, the expected annealing temperature would be close to 2000 K.

Experiment

In accordance with a preferred embodiment of this invention, amorphous carbon films were deposited in vacuum using conventional pulsed-laser deposition with a rotating graphite target and a KrF (248 nm) laser. Importantly, the carbon source is a solid target, preferably graphite, in contrast to the gaseous carbon sources typically used to deposit diamond-like carbon (DLC) films. High laser fluences, >50 J/cm$^2$, incident upon the graphite target were used to obtain films with the highest concentration of 4-fold coordinated carbon. Transmission electron energy loss spectroscopy (EELS) for these films revealed only very small intensity at the energy position of the π* excitation and a plasmon energy of 31 eV. The film density, measured by x-ray reflectivity, was determined to be 3.0 g/cm$^3$ which, together with the EELS results, indicates a carbon film with a high (≧70%) percentage of 4-fold coordinated carbon atoms (sp$^3$), the remainder being 3-fold coordinated (sp$^2$) These amorphous tetrahedrally-coordinated carbon films are referred to as a-tC and are a form of amorphous diamond. They are distinguishable from "glassy carbon", which consists entirely of 3-fold carbon, and from diamond-like carbon, DLC, which is deposited using carbon from a gaseous source (typically hydrocarbons or fluorocarbons) and which often contains hydrogen (>0.5%). These films also differ from crystalline diamond, polycrystalline diamond, and nanocrystalline diamond in that the a-tC has no long range order (over length scales at least 1 nm), and only diffuse reflections are observed in electron or x-ray scattering measurements of a-tC.

A key feature of these a-tC films prepared in the manner described above and which sets them apart from most other amorphous carbon films is that the 4-fold coordinated carbon atoms are in a bonding environment that is metastable with repect to the 3-fold coordinated carbon atoms. The energy needed to convert a 4-fold coordinated carbon atom to 3-fold, i.e. the activation energy (EA), is not single-valued, but is distributed over a range in energies and is described by an activation energy distribution function, N(E$_A$). This distribution of activation energies is unique to this material, and it obeys the following relationship:

Criterion I:

$$\int_0^\infty N(E_A)\{1 - \exp[-3.6 \cdot 10^{16} e^{(-13.3 \text{eV}^{-1} \cdot E_A)}]\} dE_A > 0.06$$

Physically, this means that a one hour anneal at 600° C. leads to the conversion of more than 6 atomic % of the 4-fold coordinated carbon atoms to 3-fold coordination. The details for determining the distribution N(E$_A$) is discussed below. Importantly, however, those amorphous carbon films that have a distribution, N(E$_A$), that does not meet the above criterion will not stress relax following the procedure described in this patent. Instead, much higher temperatures would be required for full stress relaxation or even partial stress relaxation.

For the a-tC films that were created using the procedure discussed above, stress relaxation is observed following annealing at temperatures <600° C. on a variety of substrates, including Si, SiO$_2$, W, sapphire, and other substrates. The typical determination of film stress is made by measuring wafer curvature, using a stylus profilometer or light scattering, and Stoney's equation. Several different annealing treatments give essentially identical results, provided the time and temperature annealing profiles are similar and the annealing ambient is inert (non-oxidizing). These different annealing treatments include rapid thermal annealing in argon, furnace annealing in vacuum, annealing on a hot plate in nitrogen, or annealing in high vacuum using a radiative heater. For the rapid thermal anneals, the sample was quickly (~5 sec.) brought to the desired temperature where it was held for a period of time (>1 min.) and then rapidly cooled back down to room temperature (the initial 100 to 200° C. drop in temperature occurred in several seconds while the slower cool down to room temperature took up to several minutes for the highest anneal temperatures). For these experiments, the wafer curvature was measured with the sample at room temperature. In situ measurements of film stress using light scattering to detect wafer curvature have also been used with the same results.

Results

The time- and temperature-dependent stress relaxation of a-tC films that have been annealed in a rapid thermal annealer is shown in FIG. 1. The onset of stress relaxation occurs as low as 100° C., while essentially complete stress relaxation is observed following annealing more than one hour at 600° C. These results are very unexpected when viewed in terms of conventional stress relaxation mechanisms. First, the stress relaxation in a-tC begins at surprisingly low temperatures—temperatures which result in no significant stress relaxation for other hard ceramic films, such as boron nitride. Secondly, the stress is observed to be reduced, within measurement uncertainty (~100 MPa), to zero by 600° C. annealing, which represents a much lower level of stress than previously observed for any other as-deposited a-tC film. Thirdly, the nature of the time and temperature dependence of the stress relaxation is suggestive of relaxation processes with a distribution of activation energies (non-linear time dependence and significant changes with temperature), as opposed to a viscous flow stress relaxation. Finally, after stress relaxation, the a-tC films show a slight density decrease, not the density increase which is often found after annealing glassy materials.

Stress relieved a-tC films have several distinguishing characteristics. First, and most importantly, when the film stress is measured, the stress is found to be very low or immeasurably small (about −100 MPa to 100 MPa), but the film still contains a reasonably high (about 50% or more) concentration of 4-fold coordinated carbon atoms. The film stress may be measured by several techniques, including examining wafer curvature, by releasing the film from the substrate and looking at the shift in Raman vibrational frequency (very little change would indicate that the film had little stress), by partially releasing the film from the substrate and looking for dimensional changes (if the film had high compressive stress, the film may show a dilation of several, about 6, percent), by creating micromechanical structures from the film, such as doubly-clamped beams, and measuring the force required to distort the beam or measuring the buckling of the beam itself, by creating membranes of the film and measuring the pressure required to bulge the membrane, or, potentially, by measurement of the radial distribution function (RDF) for the film (stress relief should give rise to a characteristic and noticeably different RDF compared to high stress a-tC films). Secondly, it is necessary to use stress relieved a-tC films in order to fabricate thick a-tC films. Therefore, the existence of a thick a-tC film may be a distinguishing characteristic of stress relieved a-tC. Finally, another signature of a stress relieved a-tC film may be a noticeable increase in the number of "oriented" 3-fold atoms. It is conceptually possible to measure the increase in oriented 3-fold atoms by electron spin resonance (ESR), but no clear signature has been found at this time.

Discussion

Stress Relaxation Background

The unexpected nature of stress relaxation in a-tC can be appreciated by comparison to conventional stress relaxation behavior observed in other systems. Many amorphous thin films exhibit stress relaxation (a decrease in film stress with time under constant strain conditions) in response to the initial stress state created upon deposition or growth (for thin films, the stress state is biaxial with the magnitude of the in-plane stress typically much larger than the out-of-plane stress). In many of these systems the relaxation is described by viscous flow, which is characterized by a viscosity, $\eta = \tau/\dot{\gamma}$, where $\tau$ and $\dot{\gamma}$ are the shear stress and shear strain rate, respectively.

Under conditions of constant strain ($\dot{\epsilon}=0$) and a time-independent viscosity, the stress decays exponentially with time, t:

$$\sigma = \sigma_0 e^{-\left[\frac{Et}{6\eta(1-\nu)}\right]},$$

which is the characteristic 'Maxwell' form for stress relaxation. Some special materials, e.g. silicone rubbers, do behave in correspondence with the Maxwell model; however, in many other systems, the response is more complicated. In order to model these more complicated materials, a time-dependent viscosity is frequently used in which the time dependence of the viscosity is characteristic of the defect production/annihilation kinetics which cause the stress relaxation. For bimolecular reactions the kinetics are described by $\eta = \eta_0 + \dot{\eta} t$, or for unimolecular reactions, $\eta = \eta_0 e^{kt}$, where $\eta_0$ is the initial viscosity and k is a reaction rate constant.

In contrast, the stress relaxation observed in a-tC films is qualitatively different from that observed for glassy materials. Given two glassy materials, stress relaxation will occur at lower temperature for the material with the lower glass transition temperature $T_g$. While there are no firm correlations of $T_g$ with materials properties, empirical relationships have been established which relate $T_g$ to the melting temperature, $T_m$, or Debye temperature of the solid. a-tC films do not melt in any classical sense, at least under atmospheric pressure, although the Debye temperature of its crystalline analog, diamond, is one of the highest of all materials (2340 K for diamond compared to 550 K for c—$SiO_2$ and 500 K for a—$SiO_2$). Therefore, if a-tC stress relieved in the manner of a glassy material, little or no relaxation would occur in the temperature range <600° C., which is contrary to the experimental findings. In comparison, $SiO_2$ does shown stress relaxation in this temperature range. It may be concluded that stress relaxation in a-tC is not a conventional viscous flow process.

Figure 2:
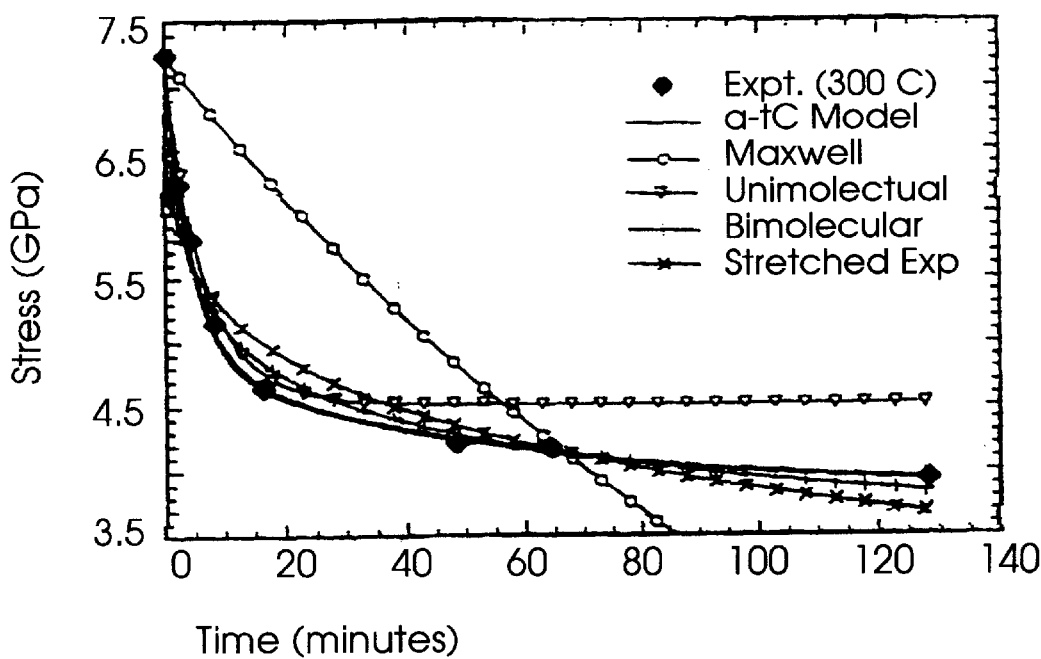
FIG. 2 shows stress relaxation data for a-tC film with model fits of the data.

To show that simple viscous flow models do not describe stress relaxation in a-tC, FIG. 2 shows fits to the stress relaxation data for a-tC at 300° C. assuming a Maxwell model, unimolecular or bimolecular viscosity models, and a stretched exponential fit (a stretched exponential or Kohlrausch-Williams-Watts law is frequently observed for many relaxation processes in glassy materials) all compared to the new a-tC stress relaxation model which is presented below and shown as the bold solid line in FIG. 2 and the lines through the data in FIG. 1. Of these models, the a-tC model gives best agreement with experiment. This is especially true when the models are compared to the data over the entire, 100° C. to 600° C., temperature range (not shown).

The a-tC Stress Relaxation Model

The unique nature of the stress relaxation in a-tC is due to the ability to transform 4-fold coordinated carbon atoms to 3-fold coordination by thermal annealing. This transformation is one which is favored thermodynamically, but limited kinetically by an activation energy barrier. The orientation of the newly created 3-fold site is a function of the stress in the film. The reason for this is simple: the typical carbon 3-fold site has 3 planar bonds of $sp^2$ hybridization and a bond normal to the plane of $p\pi$ hybridization. The $sp^2$ bond length is shorter than the $sp^3$ bond length of a 4-fold coordinated atom. The $p\pi$ bond is much longer than an $sp^3$ bond, however. Therefore, replacement of a 4-fold coordinated atom with a 3-fold coordinated atom imparts a local strain in the surrounding matrix. The strain field is negative (tensile) in the plane of the $sp^2$ bonds and positive (compressive) normal to this plane. The product of this strain with the stress in the film is the strain energy. Because the system will seek to minimize the strain energy, there is a thermodynamic driving force for the newly created 3-fold sites to be oriented with the $sp^2$ bonds in the plane of the film. This gives rise to a local negative strain which causes a reduction in film stress.

Figure 3:
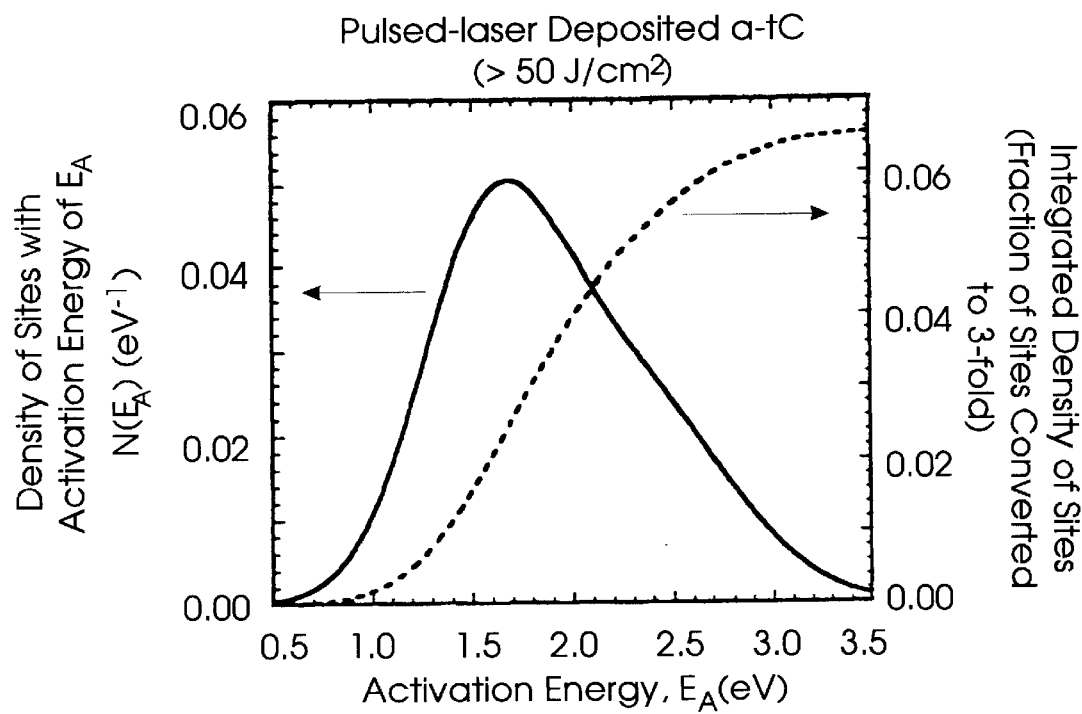
FIG. 3 shows the measured distribution of activation energies for a-tC.

Because of this atomistic process, the time and temperature dependence of the stress relaxation can be simply modeled as a series of first order chemical reactions involving converting a 4-fold coordinated carbon atom into one of 3-fold coordination. This chemical reaction requires surmounting an activation energy, $E_A$. Note that this is not a diffusional process. Because the material is amorphous and the local environment around each atom is unique, there is not one $E_A$, but rather a distribution of activation energies, $N(E_A)$. The resulting equation for stress relaxation in a-tC is $$\sigma(t,T) = \sigma_0 + \frac{\varepsilon_{sp^2-sp^3} E}{1-\nu} \int_0^\infty N(E_A)\left\{1 - e^{\left[-\nu_0 t e^{-(E_A/k_B T)}\right]}\right\} dE_A$$

where $\sigma_0$ is the initial film stress, $\epsilon_{sp^2-sp^3}$ is the strain associated with replacing a 4-fold atom with a 3-fold atom (~−0.08), E is the elastic modulus of diamond (~1100 GPa), $\nu$ is the Poisson ratio (~0.1), $N(E_A)$ is the distribution in activation energies, $E_A$, and $\nu_0$ is the attempt frequency (about $10^{13}$ sec$^{-1}$). By fitting the time-temperature stress relaxation behavior, the distribution in activation energies for 4-fold to 3-fold conversion has been determined, and this is shown in FIG. 3, where the solid curve shows $N(E_A)$ for a-tC material, and the dotted curved is the integral of $N(E_A)$. It is seen from the right panel of FIG. 3 that the integral exceeds 0.06, satisfying Criterion I. We also see that there is a minimum increase in the number of 3-fold coordinated carbon atoms of about 6.5 atomic % in order to achieve full stress relaxation. In other words, if the material originally consisted of 30% 3-fold carbon atoms, following complete stress relaxation the 3-fold concentration would be greater than 36.5% (but not above 50%). This modest increase in 3-fold concentration has almost no deleterious effect on the hardness or other film mechanical properties.

Figure 4A:
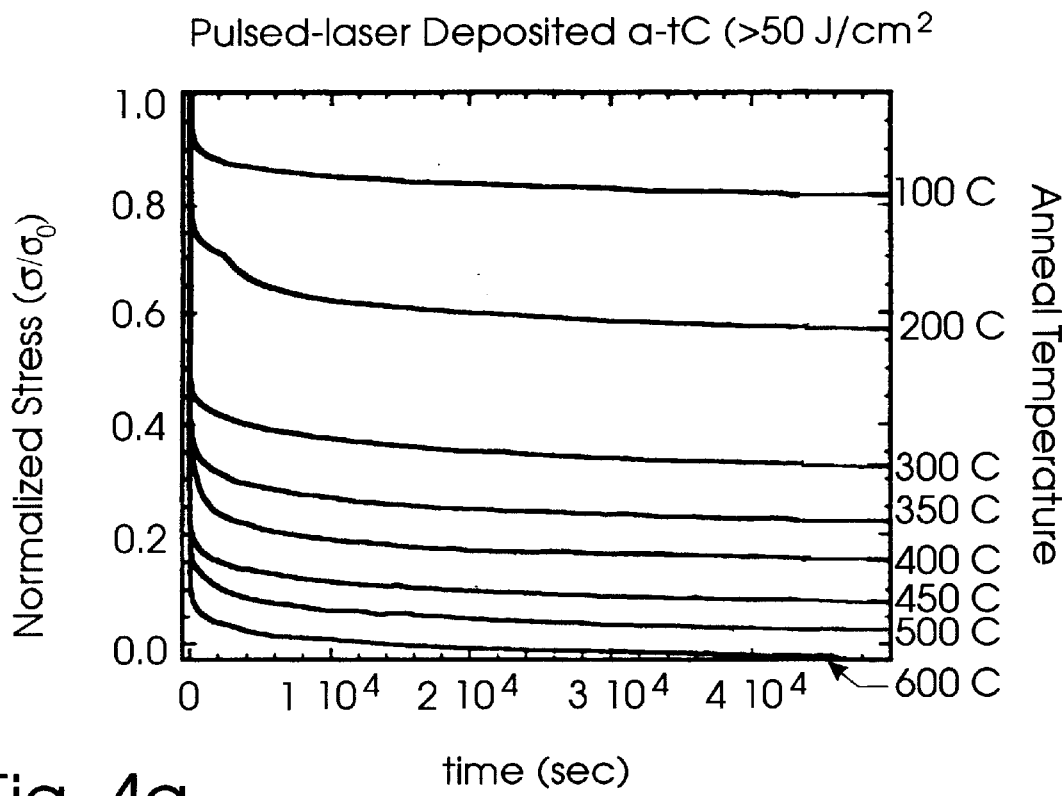
FIGS. 4(a)–(b) shows stress relaxation for an a-tC film compared to stress relaxation in a filtered cathodic arc deposited amorpous carbon film.
Figure 4B:
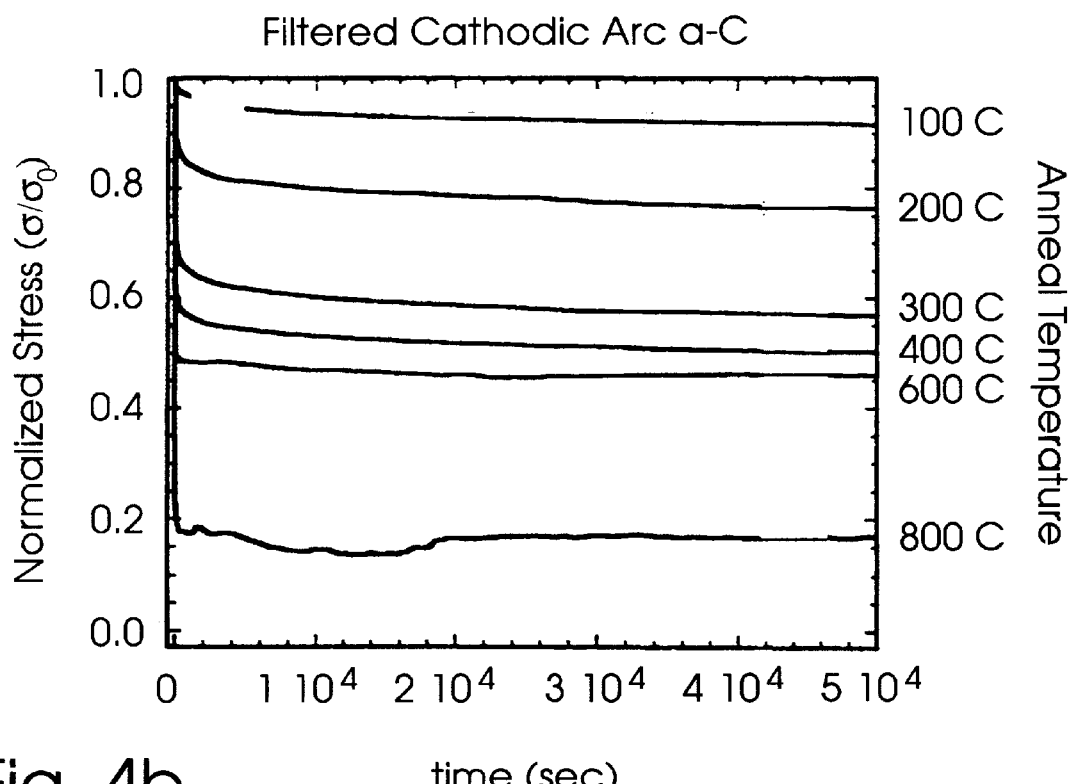
Figure 5:
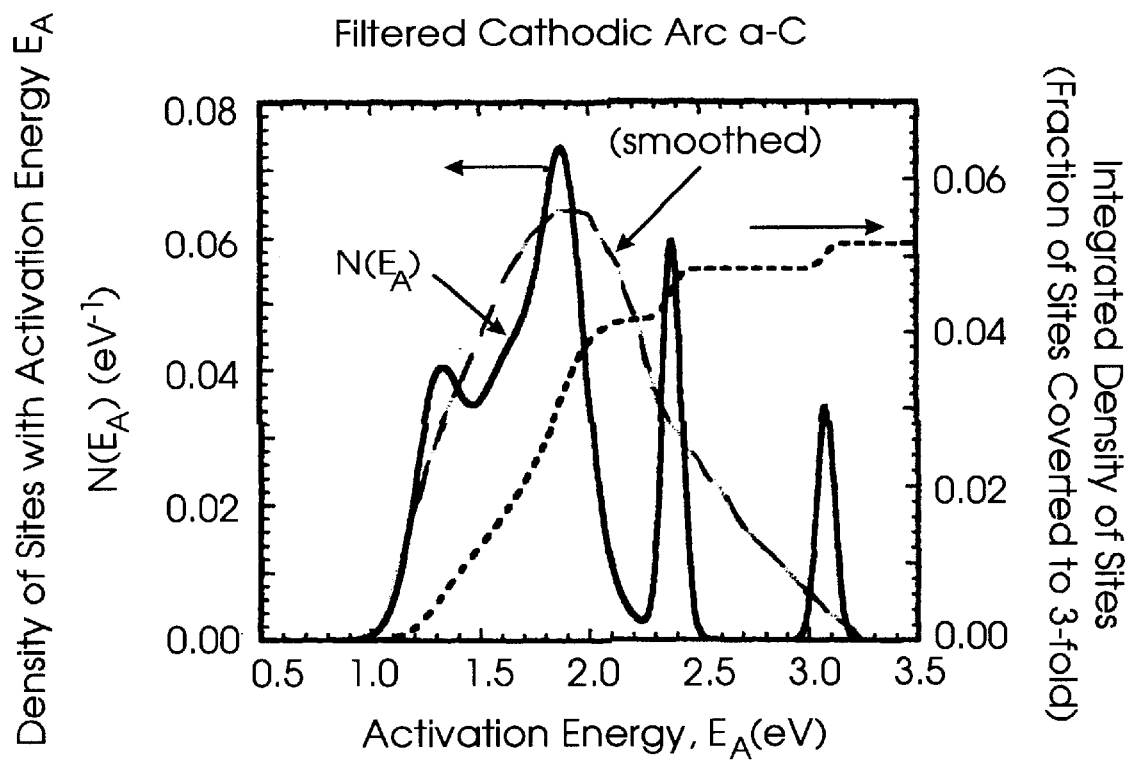
FIG. 5 shows the measured distribution of activation energies for the filtered cathodic arc amorphous carbon film.

The ability to obtain a stress-free film of hard amorphous carbon following annealing at modest temperatures, e.g. 600 C, is limited to those carbon films that have a distribution of activation energies for conversion of 4-fold to 3-fold that meets criterion I, stated above. Amorphous carbon films that have differences in their internal bonding such that criterion I is not satisfied do not fully stress relieve following thermal annealing, even though the bulk film properties (e.g. hardness, Raman spectra, density, etc.) may be quite similar to the a-tC films. One example of this is shown in FIG. 4. In FIG. 4(a), the time-temperature stress relaxation behavior of a typical a-tC film that meets criterion I is shown. FIG. 4(b), shows the time-temperature stress relaxation of a carbon film that was synthesized using a filtered cathodic carbon arc process. This process uses a solid carbon target, like the PLD film, but the energies of the carbon species and the ratio of carbon ions to neutrals in the plasma is different. The resulting film is very similar in terms of hardness, Raman spectra, density, etc., however. Note that this film does not fully stress relax, even at temperatures of 800° C. The $N(E_A)$ of the filtered cathodic arc film has been measured, see FIG. 5, and it is observed that it does not meet Criterion I (the integral (dotted line) only reaches about 0.05). The most noticeable difference between the $N(E_A)$ for this material and a-tC (see FIG. 3) is the lack of low activation energy barriers (below 1 eV) for the filtered cathodic arc material.

Figure 6:
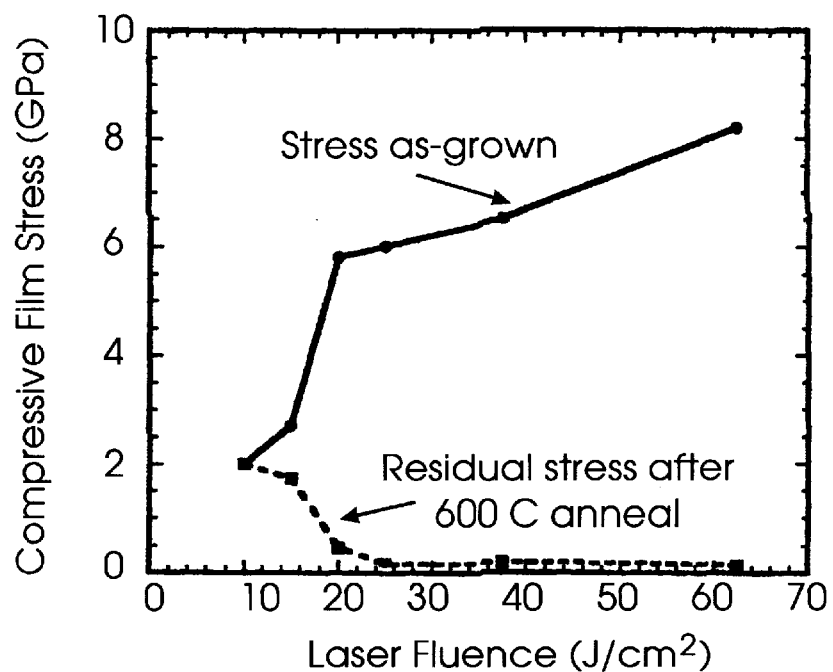
FIG. 6 shows stress relaxation after 600° C. annealing for PLD amorphous carbon films as a function of laser fluence.

This finding does not imply that filtered cathodic arc amorphous carbon films can never be made to fully stress relax. One would need to optimize the deposition of the film until the measured $N(E_A)$ meets Criterion I, however, before full stress relaxation can be achieved. It is also not true that all PLD amorphous carbon films will meet Criterion I and fully stress relax. FIG. 6 shows a plot of the film stress of PLD amorphous carbon films in the as-grown state and following annealing at 600° C., plotted as a function of the laser fluence used to deposit the film. Note that only for those films deposited with the higher laser fluences (above about 30 J/cm$^2$) is full stress relaxation observed. Importantly, for the films deposited with the lowest laser fluence, no stress relaxation is observed following 600° C. annealing.

Many other carbon films are also not expected to stress relax in the manner described for the a-tC films. Glassy carbon films are close to 100% 3-fold coordinated and thus have no means to convert 4-fold coordinated carbon to 3-fold coordination. Crystalline diamond films have high activation energies for conversion of 4-fold carbon to 3-fold carbon since the structure is almost 100% 4-fold coordinated. Therefore, they do not meet Criterion I. Lastly, many DLC films outgas H when they are annealed above 250° C. This process often has severe deleterious effects on the film properties and does not lead to full stress relaxation.

Lastly, it should be noted that Criterion I holds even after an a-tC film has been fully stress-relieved. The stress relaxation at low temperature is actually an irreversible chemical reaction that converts some 4-fold coordinated carbon into 3-fold coordinated carbon. After stress relaxation takes place, the distribution of activation energies changes. In particular, the low activation energy barriers have been "used up". Therefore, once the a-tC film has been stress relieved at high temperature, e.g. 600° C., annealing at lower temperatures will not result in any additional stress relaxation (unless extremely long anneal times are used). In this sense, once an a-tC film has been annealed at high temperature, it is a no longer an amorphous carbon film that can be stress relaxed at low temperature (Criterion I is no longer satisfied). This irreversible nature of the stress relaxation is another characteristic of the stress relaxation in a-tC that distinguishes it from the conventional diffusional stress relaxation.

Working Range

For the a-tC film, it is necessary to select an annealing condition which leads to the correct amount of conversion of 4-fold coordinated carbon to 3-fold coordinated carbon, as annealing at too high of a temperature or for too long may lead to the creation of too much 3-fold carbon and a "softening" of the film mechanical properties. Generalization of this condition is difficult, as an annealed, stress-relieved film may be hard enough for some applications but not hard enough for other applications. As an aid to understanding the process which is believed to occur during the treatment of an as-deposited film according to this invention, the "softening" point may be somewhat arbitrarily defined as the point at which the elastic modulus, E, of the a-tC film decreases to less than one half of its initial value.

The 3-fold concentration at which this softening occurs may be estimated from percolation theories of bond coordination in networks. The first step is to determine the critical network coordination, $r_p$, below which a rigid network becomes soft. For an idealized isotropic network (i.e., a theoretical study of a perfect network, not a study of materials) He and Thorpe, Phys. Rev. Lett. 54, 2107 (1985) found that $r_p=2.4$. This sets a lower bound on $r_p$. An upper bound is set by including the possibility of clustering of 3-fold sites into graphitic planar geometries. Under these conditions, Robertson, Phys. Rev. Lett. 68, 220 (1992), found that $r_p$ for a-tC films is 3.0.

To estimate the upper and lower bounds for the 3-fold concentration which leads to a significant softening or reduction of E (such as 50%), we use a modified version of a relation between E and $r_p$ suggested by He and Thorp:

$$E = E_0 \left( \frac{\bar{r} - r_p}{r_0 - r_p} \right)^{1.5} + E_i,$$

where $E_0=1000$ GPa is the observed elastic modulus for highly tetrahedral coordinated a-tC with about 30% 3-fold sites (i.e., 70% is the highest possible content of 4-fold sites), $\bar{r}$ is the average coordination number of the carbon network, $r_0=3.7$ is the average coordination corresponding to the measured $E_0$, and $E_i=32$ GPa is the residual elasticity of a fully 3-fold coordinated network (glassy carbon). Assuming that $2.4 \leq r_p \leq 3$, as discussed above, then solving the relation for a softening of 0.5 $E_0$ results in $3.18 \leq \bar{r} \leq 3.42$. In other words, a softening of the elastic modulus by 50% occurs if the 3-fold concentration increases from the initial value of 30% to a value somewhere in the range from 56% to 80%.

Experimental data is not available to determine how much annealing is required for this reduction, as this is a far greater amount of annealing than is required for stress relief. It is known that annealing a-tC for any length of time at more than 1000° C. will convert substantially all the 4-fold sites to 3-fold sites, and completely soften the film. It is also known from the experimental data presented above that a modest increase of 6.5–15% in 3-fold sites is sufficient for stress relief and causes a measured decrease in elastic modulus from ~1100 GPa to somewhere between 700 and 1000 GPa.

Verification of the Model

Several experimental measurements have been performed which support the stress relaxation model as described here. The first finding is that optical absorption within the film at visible wavelengths is observed to increase following the stress relaxation anneal. Since the optical absorption at visible wavelengths is due to local absorption within networks or clusters of 3-fold coordinated carbon, this finding is indicative of an increase in the concentration of 3-fold coordinated carbon. Also, the film density is observed to decrease, which is consistent with 4-fold to 3-fold conversion. From the stress relaxation model presented here, a density decrease of greater than 0.05 g/cm$^3$ is expected; a density decrease of 0.10 g/cm was actually observed by x-ray reflectivity. Finally, there are changes in the electrical conductivity of the a-tC films which are fully consistent with the conversion of 4-fold to 3-fold carbon as predicted by the stress relaxation model. These electrical measurements are described more fully below.

Figure 9:
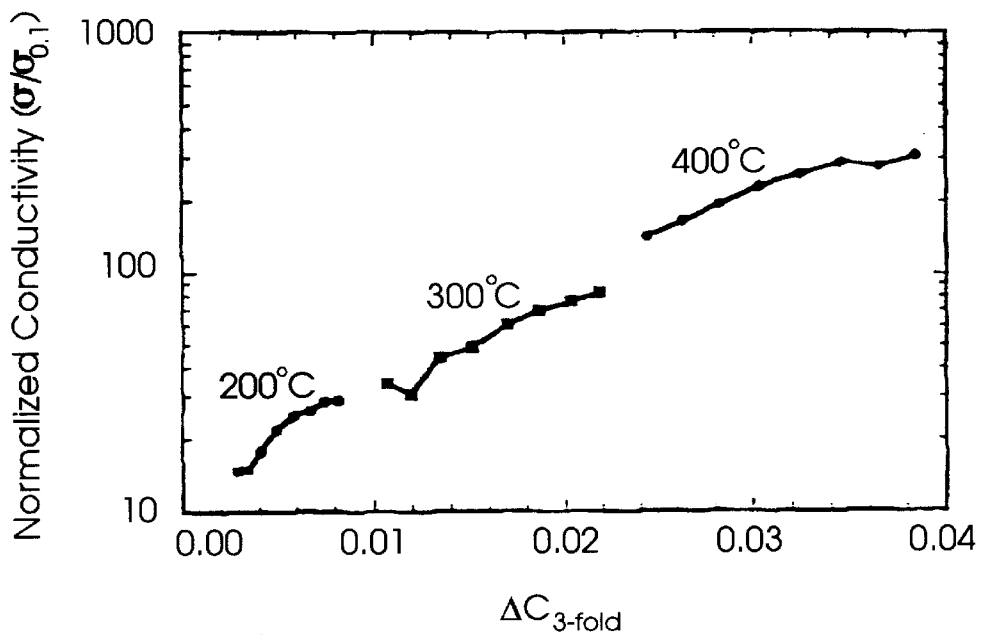
FIG. 9 shows the electrical conductivity of a-tC as a function of change in 3-fold concentration.
Figure 7:
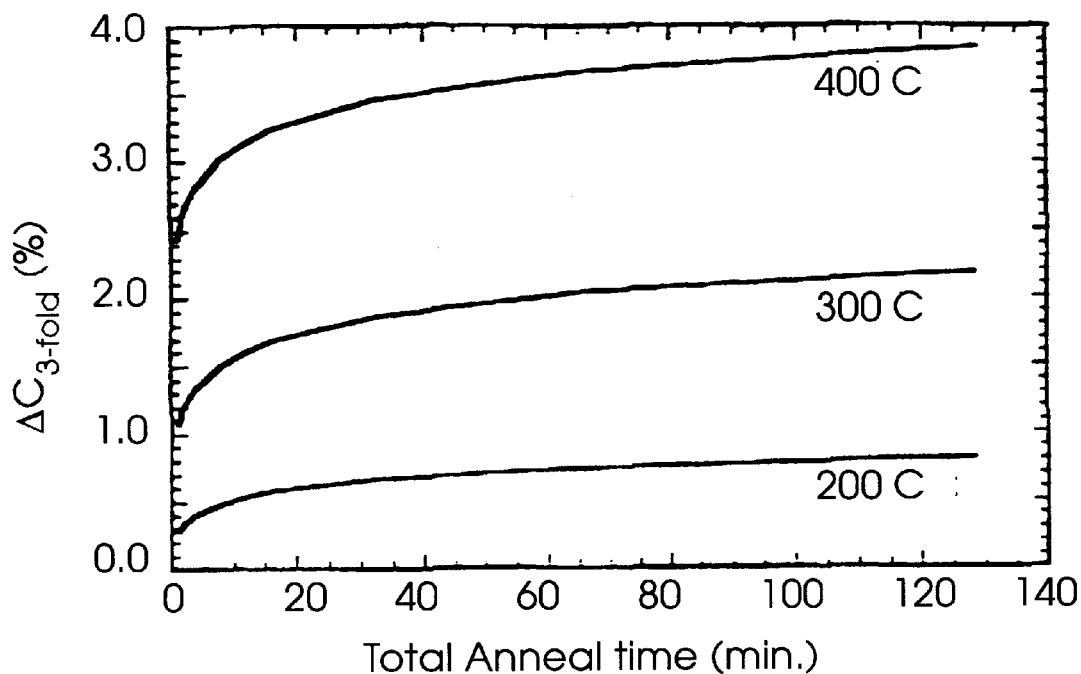
FIG. 7 shows derived changes in 3-fold concentration for an a-tC film.
Figure 8:
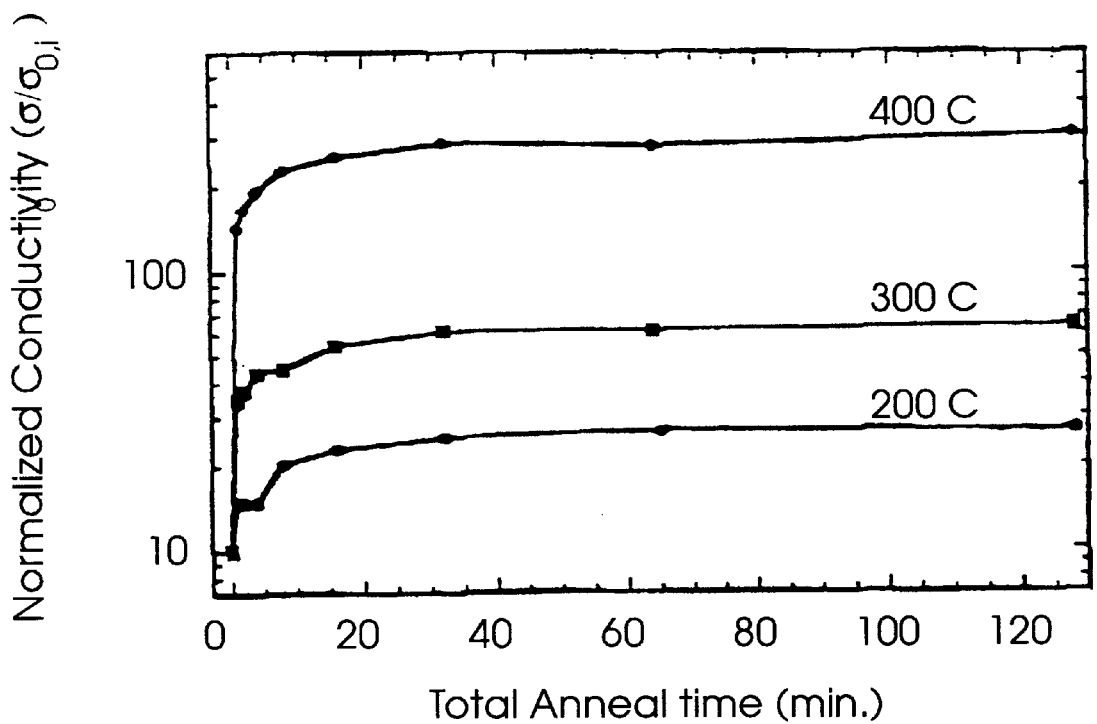
FIG. 8 shows measured conductivity of a-tC following time-temperature annealing.

FIG. 7 shows the calculated change in 3-fold concentration with time-temperature annealing as derived from the a-tC stress relaxation model. FIG. 8 shows the measured change in film electrical conductivity with time-temperature annealing. The functional behavior of these two properties (change in 3-fold content and change in electrical conductivity) is similar. This similarity is emphasized in FIG. 9 where the change in electrical conductivity is plotted as a function of the change in 3-fold carbon concentration. An approximately linear relationship is obtained which indicates that the electrical conductivity in a-tC is exponentially proportional to the change in carbon 3-fold concentration. It can be shown that this exponential dependence of conductivity on change in carbon 3-fold concentration is due to a change in the activation energy for electrical transport, and the activation energy for transport is directly related to the amount and connectivity of the 3-fold carbon atoms.

These results lead to the following conclusions: The observed change in electrical conductivity (FIG. 8) is consistent with a change in the carbon 3-fold concentration as shown in FIG. 7, but FIG. 7 is also consistent with the observed stress relaxation, assuming the validity of the a-tC stress relaxation model (FIG. 7 was in fact derived from the stress relaxation model and the data on stress relaxation). Therefore, it appears that stress relaxation in a-tC and the ability to synthesize stress-relieved a-tC films is intimately connected with the unusual property of these carbon films to convert to and/or redistribute 3-fold carbon. This feature is not found in non-carbon materials.

Embodiments of the Invention

The existence of stress relieved a-tC films immediately enables new applications because of two important properties. The first is that stress relieved a-tC films can be made thick (>3 μm). Conventional a-tC films can only routinely be made much thinner (up to about 1500 Å) because the stress in the film causes bonds to be broken at the film/substrate interface, resulting in loss of adhesion with the substrate. The second is that because of the low stress, large, unsupported membranes and released a-tC structures with low distortion can be created. Such membranes in high stress material are either impossible to construct or are severely distorted. Using this invention, stress relieved a-tC membranes over 1" in diameter with a thickness of 600 Å have been demonstrated (the ultimate limit to membrane size is not known).

Thick, multi-layer a-tC films

Thick a-tC films can be produced from stress relieved a-tC films by a process of successive depositions and stress-relief annealing. The steps are as follows: (A) an a-tC film is deposited up to a thickness less than the thickness upon which the film spontaneously de-adheres from the substrate due to the film stress (about 1500–2000 Å for Si substrates); (B) the stress in this film is then relieved by a brief anneal at 600° C. for a few (e.g. 2) minutes to create stress relieved a-tC; (C) a second layer is then deposited on the first; and (D) a short stress relief anneal at 600° C. is performed. Steps (A)–(D) are repeated as often as desired, until the desired film thickness is reached.

Many applications require thick coatings of a-tC. One example is hard coatings for tribological (wear-resistant) coatings on military, industrial, or consumer products. We have been able to grow thick films of thickness >3 μm and stress relieved a-tC having hardness and stiffness better than 90% of that of crystalline diamond, and possessing exceptional wear characteristics.

Another application of stress free a-tC films is in microelectromechanical systems (MEMS) and micromachined structures. In order to work, these structures need films with very low stress and very low stress gradients. The devices are fabricated by depositing a thick structural film (about 1 μm or more) with little stress upon a thick (about 1 μm or more) sacrificial layer. The structural layer is then patterned and etched. Finally, a timed wet chemical etch is used to selectively remove the sacrificial layer. A controlled amount of undercutting of the sacrificial layer is allowed to occur. This permits selective release of structures (structures which are thin in the lateral dimension can be released, while structures which are thick in the lateral dimension remain attached to the substrate). Using this process, we have produced cantilever beams, diaphragms, comb drive actuators, and a myriad of other structures, all fabricated from stress-free a-tC films. For reference on MEMS fabricated from Si, see U.S. Pat. Nos. 5,631,514 and 5,649,423.

The stress relieved a-tC film-based MEMS offer several advantages to conventional Si MEMS. The stress relief temperature is 600° C., which is much lower than the 1100° C. stress relief temperature for the typical MEMS structural material, poly-Si. This is important for reducing the thermal budget when the MEMS are integrated with electronics. Also, the stress relieved a-tC films exhibit superior surface, mechanical, and chemical properties. They are stiffer and the surfaces are hydrophobic, which makes stiction less of a problem. They have a low coefficient of friction and are extremely wear-resistant, and they are chemically inert, so they are not influenced by moisture or other environmental variables. This can enable the realization of ultra-reliable or ultra-low stiction MEMS.

Deformable a-tC MEMS or Structures

The a-tC material stress relieves in response to the built-in internal stress in the as-deposited film. It is also possible to apply an external stress, followed by the stress relief anneal, to lock in a permanent deformation in the material. For example, as shown in FIG. 10, consider a simple mechanical element fabricated using the MEMS fabrication procedure outlined above. Application of an external force can deform the structure. This force leads to the appearance of stress in the film (e.g. a tensile stress at the top surface and a compressive stress at the bottom surface). However, in accordance with this invention, the structure is given a stress relief anneal at 600° C. with the force still applied. Following cool down and removal of the applied force, the structure has been permanently deformed. We have demonstrated this ability using our cantilever beam structures fabricated from a-tC.

This property may be useful for coupling one a-tC MEMS element formed on one plane to a MEMS element on another plane. It may also be useful for optical applications. For example, it may be possible to synthesize a parabolically curved element to act as a focusing optic, etc.

Transfer of a-tC Films to Other Substrates

There are substrates for which it is difficult to imagine that stress relieved a-tC films could be deposited upon. An example is a plastic substrate. Even if it were possible to deposit the thin a-tC film on the plastic substrate without the stressed film de-adhering, the plastic substrate would not withstand the 600° C. anneal used to fabricate the stress relieved a-tC material. However, an alternative exists. The stress relieved a-tC film can be fabricated on a conventional substrate such as silicon (FIG. 11A). Another substrate may then be bonded to the free surface of the a-tC material (FIG. 11B). For plastics, an adhesive or epoxy bonding agent could be employed. Then the original substrate can be etched away, which effectively transfers the stress relieved a-tC film to the new substrate (FIG. 11C).

There are reasons why it may be desirable to have a stress relieved a-tC film on a new substrate. For example, it may be desired to coat a plastic with a thick (>1 $\mu$m) layer of stress relieved a-tC in order to improve the wear resistance or surface hardness of the plastic. It would not be possible to deposit such a thick a-tC layer on the plastic directly.

a-tC Membranes

With stress relieved a-tC, the fabrication of free-standing membranes becomes straightforward. Membranes are produced from stress relieved a-tC by depositing the stress relieved a-tC on a substrate capable of being etched, such as silicon (FIG. 12A). The membrane is produced by masking the backside of the substrate with a material capable of resisting the chemical or ion etchant (examples include wax, photoresist, tape, deposited layers, etc.). The a-tC surface is unprotected. The whole sample is then immersed in the desired etchant (for Si, a mixture of HF, $HNO_3$, and $CH_3COOH$ or a solution of KOH both work), or, alternatively, the backside of the sample is ion etched, using an etch which selectively stops at the carbon layer. When the process is finished, an a-tC membrane is produced which is supported on its perimeter by the substrate, but is free-standing everywhere else (FIG. 12B). Using chemical etching of stress relieved a-tC coated Si wafers, free standing membranes greater than 1" in diameter and only 600 Å thick have been produced. It is also possible to create membranes without using a back-side etching process by depositing the membrane material on a thick sacrificial layer and selectively removing the sacrificial layer beneath the membrane.

a-tC membranes are important for many applications, including sensors and masks. a-tC membranes may be particularly advantageous for transmissive x-ray or electron masks, because these masks require thin membranes, and membranes fabricated from low atomic number materials, such that electrons and x-rays can pass through readily. In order to create the mask, an a-tC membrane is produced, and then an electron or x-ray absorbing material (typically a high atomic number material) is deposited and patterned on the membrane surface, as shown in FIG. 12C. In this way, electrons or x-rays pass through the mask, but are blocked in the areas where the absorbing material has been placed.

It is also contemplated that the a-tC membrane of this invention may be advantageously utilized in a flexural plate wave (FPW) sensor. Such a sensor is realized by creating a free standing membrane a few mm on a side (silicon nitride is commonly used) and then patterning a conductive meander line on the membrane surface. When the device is placed in a magnetic field and alternating current is passed through the meander line, the Lorentz force on the meander lines causes flexural plate waves to be generated in the membrane. (It is also possible to generate the plate waves non-magnetically by depositing a thin film of piezoelectric material on the membrane surface.) The resonant frequency for the waves depends on the membrane dimensions, the membrane tension, thickness, moment, and areal density. To operate the device as a sensor, a chemically active film is deposited on the membrane, such that the film selectively adsorbs/absorbs the desired chemical to sense. This causes a mass increase, which is detected as a shift in resonant frequency. Such a device is disclosed in U.S. Pat. No. 5,836,203.

The ultimate sensitivity of this sensor is increased by decreasing the areal mass density of the membrane. This can be accomplished by using ultra-thin a-tC membranes. Additionally, it may be possible to directly "write" the conductive lines into the a-tC membrane without having to deposit a conductive film, as under intense focused electron or ion irradiation, it is possible to locally graphitize an a-tC film, creating a region of high conductivity. Presumably, any focused energetic source (e.g. electrons, ions, or photons) may work. By directly writing the conductive lines, it may be possible to obviate the metal meander line deposition step, thus keeping the mass areal density low.

a-tC Optical Elements a-tC films are optically transparent and have high refractive index (about 2.5). These properties make the material an exceptional waveguide for light or a thin film transmissive optic material. Because the refractive index is high, the critical angle for total internal reflection is small. This means that light which enters one edge of an a-tC film will be wave-guided with great efficiency, except for the continual loss of light down the length of the film due to the presence of some optical absorption. In the case of transmissive thin film optics, it is necessary to etch features in the film for the focusing and diffracting of light. Since the a-tC material has such high refractive index, the thickness of the diffractive optic can be less. Therefore, a thin film of stress relieved a-tC less than one micron thick may be sufficiently thick to work as an efficient optical element. An additional advantage of stress relieved a-tC is that it may be possible to fabricate the transmissive optic and the MEMS element out of the same material, thus easing the integration of combined MEMS and optical elements.

Additionally, it is possible to construct an a-tC etalon structure by joining two stress relieved a-tC films surface to surface with a thin low n material in between (such as $SiO_2$, porous $SiO_2$, sol-gel deposited $SiO_2$, etc.). The original substrates can then be etched off to leave a thin double layer structure to act as an etalon.

Novel Electron Emission Structures Using a-tC

The stress relieved a-tC material allows the possibility of creating novel electron emission structures. a-tC is known to be an efficient electron emitter. The advantage of stress relieved a-tC is that new emission structures can be realized. For example, it is possible to transfer the a-tC material to a new substrate. When the original substrate has been removed, it is possible to obtain surface electron emission off of what was formally the buried interface of the a-tC material. Furthermore, if the new substrate is flexible (like a plastic), it may be possible to achieve curved electron emission elements. This approach may be useful if one wished to bend the substrate into a parabolic distortion to obtain electrons focused to a single point. Plastic substrates for the electron emitter may also facilitate the fabrication of flat panel displays, which is a current technology that is aggressively looking at the use of a-tC films for electron emission.

A more advanced concept would be to combine an a-tC MEMS element which is movable with an a-tC electron emitter. This could enable the fabrication of a steerable or movable electron emitter. For example, consider a cantilever beam of stress relieved a-tC fabricated using micromachining. Deflection electrode elements above and below the beam could cause movement of the cantilever beam up or down by electrostatic attraction or repulsion. At the end of the beam, electrodes would be at positive potential to extract electrons from the beam tip. By varying the potential on the deflection plates, it may be possible to create a steerable electron emitter, mechanically analogous to a rasterable electron beam steered electrostatically.

Summary

Stress relieved a-tC is a new material which distinguishes itself from other materials in that it has superior mechanical (e.g. high hardness, stiffness, wear resistance), chemical (extreme inertness), electrical (tailorable conductivity, good electron emission), and optical (transparent with high refractive index) properties when compared to other materials (for example, silicon nitride, poly-silicon, boron carbide, etc.), and unlike conventional stressed a-tC, it can be deposited as a thick film (using a multi-layer process) and can be fashioned into large area free-standing membranes. Several technologies could benefit from this material, including MEMS, micro-sensors, field emisison flat panel displays, tribological coatings, x-ray and electron masks for the semiconductor industries, and optical coatings and elements for the optics industries.

The particular sizes and equipment discussed above are cited merely to illustrate a particular embodiment of this invention. It is contemplated that the use of the invention may involve components having different sizes and shapes as long as the principle, creating the a-tC film with specific atomic structure and bonding such that Criterion I is achieved, and annealing the a-tC at no more than approximately 600° C., is followed. Furthermore, it is also expected that other methods of annealing may be employed including, but not limited to, directing a laser, ion beam, electron beam, or other energetic source at the surface of the a-tC film subsequent or during film growth so as to lead to the production or re-orientation of carbon 3-fold sites with subsequent stress relaxation whether by thermal or athermal means. This also includes annealing a-tC films at temperatures above or below 600° C. in inert or reactive ambients, provided that the amount of newly created 3-fold sites does not lead to a softening of the a-tC material. In addition, athermal processes for breaking the 4-fold bonds may be employed instead of thermal processes such as annealing. It is intended that the scope of the invention be defined by the claims appended hereto.

What is claimed is:

1. A method for making a stress-free amorphous-tetrahedrally coordinated carbon film comprising:

depositing an amorphous-tetrahedrally coordinated carbon film with specific atomic structure and bonding such that the activation energy needed to convert a 4-fold coordinated carbon atom to 3-fold is distributed over a range of energies described by an activation energy distribution $N(E_A)$ that obeys the relationship:

$$\int_0^\infty N(E_A)\{1 - \exp[-3.6 \cdot 10^{16} e^{(-13.3 eV^{-1} \cdot E_A)}]\} dE_A > 0.06; \text{ and}$$

annealing said film at sufficiently high temperature to relieve the compressive stress in said film without significantly softening said film.

2. The method of claim 1 wherein said annealing temperature is between 500 and 700° C.

3. The method of claim 2 wherein said annealing temperature is between 600 and 650° C.

4. The method of claim 3 wherein said annealing temperature is applied for no more than 20 minutes.

5. The method of claim 3 wherein said film consists essentially only of 4-fold and 3-fold carbon, wherein said anneal step causes the percentage of 3-fold carbon to increase by at least about 6.5 and the percentage of 4-fold carbon to decrease by at least about 6.5.

6. The method of claim 5, wherein the percentage of 3-fold carbon after annealing is less than 40%.

7. The method of claim 1 further comprising removing said substrate from at least a portion of the annealed film, wherein said portion is a free standing membrane.

8. The method of claim 1 further comprising:

bonding a second material to said annealed film; and removing said substrate.

9. The method of claim 8 wherein said second material has a melting temperature lower than said annealing temperature.

10. The method of claim 1 wherein said depositing and annealing steps are repeated to build up a thicker film.

11. A method for making a stress-free amorphous-tetrahedrally coordinated carbon film comprising:

depositing an amorphous-tetrahedrally coordinated carbon film on a substrate by pulse laser deposition with a laser fluence exceeding 30 j/cm$^2$ using a solid graphite target, said film consisting essentially of only 4-fold and 3-fold carbon and having high compressive stress greater than 6 GPa; and relieving the compressive stress in said film by increasing the percentage of 3-fold carbon by at least about 6.5 and decreasing the percentage of 4-fold carbon by at least about 6.5.

12. The method of claim 11 wherein said step of relieving the compressive stress comprises annealing said film at sufficiently high temperature to relieve the compressive stress in said film without significantly softening said film, the elastic modulus of said film after annealing being at least 50% of the elastic modulus of the film before annealing.

13. The method of claim 12 wherein said annealing temperature is between 500 and 700° C.

14. The method of claim 13 wherein said annealing temperature is between 600 and 650° C.

15. The method of claim 14 wherein said annealing temperature is applied for at least 10 minutes.

16. The method of claim 12 further comprising removing said substrate from at least a portion of the annealed film, wherein said portion is a free standing membrane.

17. The method of claim 12 further comprising:

bonding a second material to said annealed film; and removing said substrate.

18. The method of claim 17 wherein said second material has a melting temperature lower than said annealing temperature.

19. The method of claim 11 wherein the stress is relieved by subjecting the film to an athermal process.

* * * * *